United States Patent
Qian et al.

(10) Patent No.: US 10,411,943 B2
(45) Date of Patent: Sep. 10, 2019

(54) POLAR PHASED-ARRAY TRANSMITTER AND MOBILE TERMINAL

(71) Applicant: HUAWEI TECHNOLOGIES CO., LTD., Shenzhen, Guangdong (CN)

(72) Inventors: Huizhen Qian, Chengdu (CN); Xun Luo, Chengdu (CN)

(73) Assignee: Huawei Technologies Co., Ltd., Shenzhen (CN)

(*) Notice: Subject to any disclaimer, the term of this patent is extended or adjusted under 35 U.S.C. 154(b) by 0 days.

(21) Appl. No.: 16/249,383

(22) Filed: Jan. 16, 2019

(65) Prior Publication Data

US 2019/0149386 A1    May 16, 2019

Related U.S. Application Data

(63) Continuation of application No. PCT/CN2016/107362, filed on Nov. 25, 2016.

(51) Int. Cl.
| | |
|---|---|
| *H04B 1/04* | (2006.01) |
| *H04L 27/36* | (2006.01) |
| *H04L 25/02* | (2006.01) |

(52) U.S. Cl.
CPC .............. *H04L 27/36* (2013.01); *H04B 1/04* (2013.01); *H04L 25/02* (2013.01); *H04B 2001/0408* (2013.01)

(58) Field of Classification Search
CPC .......... H04L 27/36; H04L 25/02; H04B 1/04; H04B 2001/0408
See application file for complete search history.

(56) References Cited

U.S. PATENT DOCUMENTS 9,813,269 B1 * 11/2017 Yoon ................. H04B 1/40
9,935,663 B1 * 4/2018 Rofougaran ......... H04B 1/0483
(Continued)

FOREIGN PATENT DOCUMENTS

| CN | 103716080 A | 4/2014 |
| CN | 105981294 A | 9/2016 |

(Continued)

OTHER PUBLICATIONS

International Search Report and Written Opinion issued in International Application No. PCT/CN2016/107362 dated Jul. 7, 2017, 13 pages.

(Continued)

*Primary Examiner* — Dac V Ha
(74) *Attorney, Agent, or Firm* — Fish & Richardson P.C.

(57) ABSTRACT

The present disclosure relates to a polar phased-array transmitter and a mobile terminal. One example mobile terminal includes a baseband chip, the polar phased-array transmitter, and an antenna array. The baseband chip is configured to generate a quadrature digital baseband signal. The polar phased-array transmitter is configured to perform quadrature-to-polar conversion on the quadrature digital baseband signal to generate n amplitude signals and n phase signals, separately perform phase modulation and phase shifting on the n phase signals by using a local oscillator signal to obtain n phase modulation signals, and perform amplitude modulation and power amplification on the n phase modulation signals by using the amplitude signals to obtain n radio frequency signals. n is a natural number greater than 1. The antenna array is configured to obtain the n radio frequency signals from the polar phased-array transmitter, and transmit the n radio frequency signals.

20 Claims, 10 Drawing Sheets

(56) References Cited

U.S. PATENT DOCUMENTS

| | | | |
|---|---|---|---|
| 2006/0291589 A1* | 12/2006 | Eliezer | H03C 3/40 |
| | | | 375/302 |
| 2007/0275676 A1 | 11/2007 | Rofougaran et al. | |
| 2008/0037662 A1* | 2/2008 | Ravi | H03F 3/217 |
| | | | 375/260 |
| 2013/0120190 A1 | 5/2013 | McCune, Jr. | |
| 2014/0218104 A1 | 8/2014 | Kazuaki | |
| 2014/0241463 A1 | 8/2014 | Leenaerts et al. | |
| 2016/0099820 A1 | 4/2016 | Chakrabarti et al. | |
| 2017/0012675 A1 | 1/2017 | Frederick | |

FOREIGN PATENT DOCUMENTS

| | | |
|---|---|---|
| CN | 106058480 A | 10/2016 |
| CN | 106093893 A | 11/2016 |
| EP | 2717382 A1 | 4/2014 |
| EP | 3073572 A1 | 9/2016 |

OTHER PUBLICATIONS

Extended European Search Report issued in European Application No. 16922212.2 dated May 31, 2019, 8 pages.

* cited by examiner

Straight line shape  Oblique line shape  Flying wild geese shape

POLAR PHASED-ARRAY TRANSMITTER AND MOBILE TERMINAL

CROSS-REFERENCE TO RELATED APPLICATIONS

This application is a continuation of International Application No. PCT/CN2016/107362, filed on Nov. 25, 2016, the disclosure of which is hereby incorporated by reference in its entirety.

TECHNICAL FIELD

The present application relates to the communications field, and in particular, to a polar phased-array transmitter and a mobile terminal.

BACKGROUND

As a requirement of a wireless communications system for performance such as wide coverage and a high data rate increases, a phased-array transmitter featuring spatial power combination, beam steering, high system efficiency, high scanning resolution, and a low phase/amplitude error is urgently demanded.

The following two types of transmitters exist in the prior art:

1. A phased-array transmitter (phased-array transmitter) is a transmitter having multiple radio frequency outputs. Spatial power combination is performed for each radio frequency output by using an antenna. The phased-array transmitter implements antenna beam direction steering and scanning and the like by controlling a phase of each radio frequency output. As shown in FIG. 1, an existing phased-array transmitter 100 using an analog modulation technology mainly includes a balun 101, a 1:4 power splitter 102, a phase-shift circuit 103, a power amplifier (PA) 104, an output matching circuit 105, and a digital controller 106. An input signal $P_{IN}$ indicates a radio frequency signal obtained after analog modulation is performed on a baseband signal. $P_{IN}$ is divided into four signals after passing through the power splitter 102. After the phase-shift circuit 103 performs phase shifting and the PA 104 performs amplification on the four signals, four radio frequency signals (that is, Pout1, Pout2, Pout3, and Pout4) are output from the output matching circuit 105. The digital controller 106 is configured to control the phase-shift circuit 103 to perform phase shifting. The existing phased-array transmitter 100 has the following disadvantages: 1. Usually, system efficiency of the phased-array transmitter 100 is relatively low due to a need to balance system efficiency and linearity (to implement high linearity, the phased-array transmitter 100 cannot be used when an output power is greater than P1dB, where P1dB indicates an operating point at which a gain compression of output to input is equal to 1 dB, and dB indicates decibel). This further leads to power consumption. Therefore, the phased-array transmitter 100 is not suitable in a mobile device focusing on energy saving. 2. The phased-array transmitter 100 uses a radio frequency phase shift (RF phase shift) technology, and phase shifters in the phase-shift circuit 103 are connected in series in a radio frequency path. Non-linearity of the phase shifters may bring an amplitude error, and it is difficult for an architecture of the phased-array transmitter 100 to eliminate the amplitude error. Therefore, transmitter performance is severely affected.

2. A polar transmitter (polar transmitter) is also referred to as an envelope tracking (envelope tracking, ET) transmitter. The polar transmitter can convert a baseband signal into a phase signal and an amplitude signal, use the amplitude signal to control an output power of a PA, perform phase modulation on the phase signal, combine the phase signal obtained after the phase modulation and the amplitude signal into a radio frequency signal at a PA stage, and output the radio frequency signal. FIG. 2 shows an existing analog polar transmitter 200. A polar signal generator 201 coverts in-phase (in-phase, I)/quadrature (quadrature, Q) baseband signals into an amplitude signal A and a phase signal Φ. Digital-to-analog converters (Digital to Analog Converter, DAC) 202 and 203 respectively converts the phase signal Φ and the amplitude signal A in a digital domain into signals in an analog domain. Then an amplitude modulation circuit 206 performs modulation on an analog amplitude signal to obtain an amplitude modulation signal AM. A phase modulator 205 performs phase modulation on an analog phase signal Φ by using a local oscillator signal to obtain a phase modulation signal PM. Finally, a PA 204 combines the phase modulation signal PM and the amplitude modulation signal AM into a radio frequency signal. The analog polar transmitter 200 has disadvantages of a low data rate and narrow channel bandwidth.

Therefore, it is urgent to develop a new transmitter to meet a requirement of a wireless communications system for performance such as a wide frequency band, high scanning resolution, a low phase/amplitude error, and the like.

SUMMARY

A polar phased-array transmitter described in this specification can meet a requirement of a wireless communications system for performance such as a wide frequency band, high scanning resolution, and a low phase/amplitude error.

According to one aspect, an embodiment of this application provides a polar phased-array transmitter, including: a polar signal generator, configured to: receive in-phase and quadrature baseband signals, and perform quadrature-to-polar conversion on the in-phase and quadrature baseband signals to generate n amplitude signals and n phase signals, where n is a natural number greater than 1; and a transmit array, where the transmit array includes n transmit channels, each transmit channel corresponds to one amplitude signal in the n amplitude signals and one phase signal in the n phase signals, the n transmit channels are configured to: respectively receive the n phase signals, and respectively perform phase modulation and phase shifting on the n phase signals by using a local oscillator signal under control of n phase-shift control signals to obtain n phase modulation signals, a phase difference between any two phase modulation signals whose phases are adjacent in the n phase modulation signals is α, α ranges from 0° to 360° (including 0° and 360°), and the n transmit channels are further configured to respectively perform amplitude modulation and power amplification on the n phase modulation signals by using the n amplitude signals to obtain n radio frequency signals. The polar phased-array transmitter provided in this embodiment of this application improves phase-shift resolution by adjusting the phase difference α, so as to implement high scanning resolution. In addition, a frequency band width can be improved because a phased array is used.

In a possible implementation, each transmit channel in the n transmit channels includes: a modulation phase shifter and a power amplifier; the modulation phase shifter is configured to: receive a first phase signal from the n phase signals generated by the polar signal generator, and perform phase modulation and phase shifting on the first phase signal by using the local oscillator signal under control of a first phase-shift control signal corresponding to each transmit channel to obtain a first phase modulation signal; and the power amplifier is configured to: receive a first amplitude signal in the n amplitude signals generated by the polar signal generator, and perform amplitude modulation and power amplification on the first phase modulation signal according to the received first amplitude signal to obtain a first radio frequency signal.

In a possible implementation, each transmit channel further includes an amplitude decoder, and the power amplifier specifically includes: multiple digital power amplifiers and a signal power combiner; the amplitude decoder is configured to: decode the first amplitude signal to obtain multiple decoded amplitude signals, and control switch statuses of the multiple digital power amplifiers respectively by using the multiple decoded amplitude signals, so that amplitude modulation and power amplification are performed on the first phase modulation signal; and the signal power combiner combines signals obtained after amplitude modulation and power amplification performed by the multiple digital power amplifiers into the first radio frequency signal, and outputs the first radio frequency signal.

In a possible implementation, the multiple digital power amplifiers are switch-mode power amplifiers. In the polar phased-array transmitter provided in this embodiment of this application, a phase path and an amplitude path are separated from each other, and this strikes a balance between efficiency and linearity. Therefore, switch-mode power amplifiers can be used, and this improves efficiency of the polar phased-array transmitter and has extremely small impact on linearity of the polar phased-array transmitter.

In a possible implementation, the power amplifier is an analog power amplifier.

In a possible implementation, the modulation phase shifter includes: a phase modulator and a phase shifter coupled to the phase modulator; the phase modulator is configured to: separately receive the first phase signal and the local oscillator signal, and perform phase modulation on the first phase signal by using the local oscillator signal; and the phase shifter is configured to perform, under the control of the first phase-shift control signal, phase shifting on the first phase signal modulated by the phase modulator, so as to obtain the first phase modulation signal.

In a possible implementation, the modulation phase shifter includes: a phase modulator and a phase shifter coupled to the phase modulator; the phase shifter is configured to: receive the local oscillator signal and the first phase-shift control signal, and perform phase shifting on the local oscillator signal under the control of the first phase-shift control signal; and the phase modulator is configured to: receive the first phase signal, and perform phase modulation on the first phase signal by using the local oscillator signal obtained after phase shifting performed by the phase shifter, so as to generate the first phase modulation signal.

In a possible implementation, the polar phased-array transmitter further includes: a first signal processor, and the first signal processor is separately coupled to the polar signal generator and the transmit array; and the first signal processor is configured to separately perform digital predistortion processing on the n amplitude signals and the n phase signals generated by the polar signal generator. Digital predistortion can reduce an amplitude error caused by non-linearity to each amplitude signal, and reduce a phase error caused by non-linearity to each phase signal, thereby reducing signal distortion.

In a possible implementation, the polar phased-array transmitter further includes: a phase-shift controller, configured to generate the n phase-shift control signals.

In a possible implementation, the polar phased-array transmitter further includes: a second signal processor, the second signal processor is separately coupled to the phase-shift controller and the transmit array, and the second signal processor is configured to separately perform digital predistortion processing on the n phase-shift control signals generated by the phase-shift controller. After a phase shifter in each transmit channel is calibrated by using a phase-shift control signal obtained after the predistortion processing, higher phase-shift resolution can be implemented, and this helps to improve scanning resolution of the polar phased-array transmitter.

In a possible implementation, the n transmit channels in the transmit array may be integrated in one chip.

In a possible implementation, the polar signal generator and the transmit array may be integrated in one chip.

In a possible implementation, the transmit array, the polar signal generator, the phase-shift controller, the first signal processor, and the second signal processor may be integrated in one chip.

In any one of the foregoing possible implementations, the polar phased-array transmitter further includes: an antenna array, the antenna array includes n antennas arranged at an equal distance, the n antennas are coupled to the n transmit channels in a one-to-one manner, and the n antennas are configured to respectively receive the n radio frequency signals generated by the n transmit channels and transmit the n radio frequency signals.

In a possible implementation, the n antenna is configured to transmit the n radio frequency signals based on a beamforming technology.

In a possible implementation, a distance between any two adjacent antennas in the n antennas in an arrangement direction roughly remains unchanged.

In a possible implementation, the n antenna may be arranged in a straight line, an oblique line, a flying wild geese shape, or a circular shape.

According to another aspect, an embodiment of this application provides a mobile terminal, including: a baseband chip, the polar phased-array transmitter according to any one of the implementations of the foregoing aspect, and an antenna array; the baseband chip is configured to generate a quadrature digital baseband signal; the polar phased-array transmitter is configured to: perform quadrature-to-polar conversion on the quadrature digital baseband signal to generate n amplitude signals and n phase signals, separately perform phase modulation and phase shifting on the n phase signals by using a local oscillator signal to obtain n phase modulation signals, and perform amplitude modulation and power amplification on the n phase modulation signals by using the amplitude signals to obtain n radio frequency signals, where n is a natural number greater than 1; and the antenna array is configured to obtain the n radio frequency signals from the polar phased-array transmitter, and transmit the n radio frequency signals.

In a possible implementation, the mobile terminal is a mobile phone, a tablet, a notebook computer, or a vehicular device.

In a possible implementation, the mobile terminal is a terminal supporting a 5G mobile communications technology.

According to still another aspect, an embodiment of this application further provides a chip, including: an amplitude path, a phase path, a phase-shift circuit, and a transmit array;

the amplitude path is configured to generate a segmented thermometer code based on a clock signal and an amplitude signal, where the segmented thermometer code includes: the least significant bit and the most significant bit; the phase path is configured to perform quadrature phase modulation on a phase signal based on the clock signal by using a local oscillator signal to obtain n first phase modulation signals, where n is a natural number greater than 1; the phase-shift circuit is configured to: receive a phase-shift control code generated by a phase-shift controller, and generate n phase-shift control signals according to the phase-shift control code; and the transmit array includes n transmit channels, the n transmit channels are configured to respectively perform phase shifting on the n first phase modulation signals under control of the n phase-shift control signals to obtain n groups of second phase modulation signals, each group of second phase modulation signals includes two differential second phase modulation signals, and the n transmit channels are further configured to respectively perform amplitude modulation and power amplification on the n groups of second phase modulation signals under control of the segmented thermometer code to obtain n radio frequency signals.

Compared with the prior art, the present application provides the transmitter based on a polar phased-array architecture. An amplitude path is separated from a phase path, and a digital predistortion technology is combined. Therefore, the transmitter has advantages such as a wide frequency band, high scanning resolution, and a low phase/amplitude error, and can meet a performance requirement of a wireless communications system.

BRIEF DESCRIPTION OF DRAWINGS

To describe the technical solutions in one embodiment of the present application or in the prior art more clearly, the following briefly describes the accompanying drawings required for describing the embodiments or the prior art. Apparently, the accompanying drawings in the following description show merely some embodiments of the present application, and a person of ordinary skill in the art may still derive other drawings from these accompanying drawings without creative efforts.

DESCRIPTION OF EMBODIMENTS

To better understand technical solutions of the present application, a phased-array system is briefly described first. In a wireless transceiver system, an isotropic antenna evenly transmits radio frequency signals in all directions in an ideal case. However, a large amount of energy in the radio frequency signals transmitted by the isotropic antenna is not received by a receive antenna, resulting in a relatively low received signal power and a relatively large spatial transmission power loss. A directional antenna beam can be generated by using a beamforming technology. Therefore, applying the beamforming technology to the wireless transceiver system can resolve problems of a low received signal power and a large spatial transmission power loss. The phased-array system is a wireless transceiver system using the beamforming technology.

Figure 3:
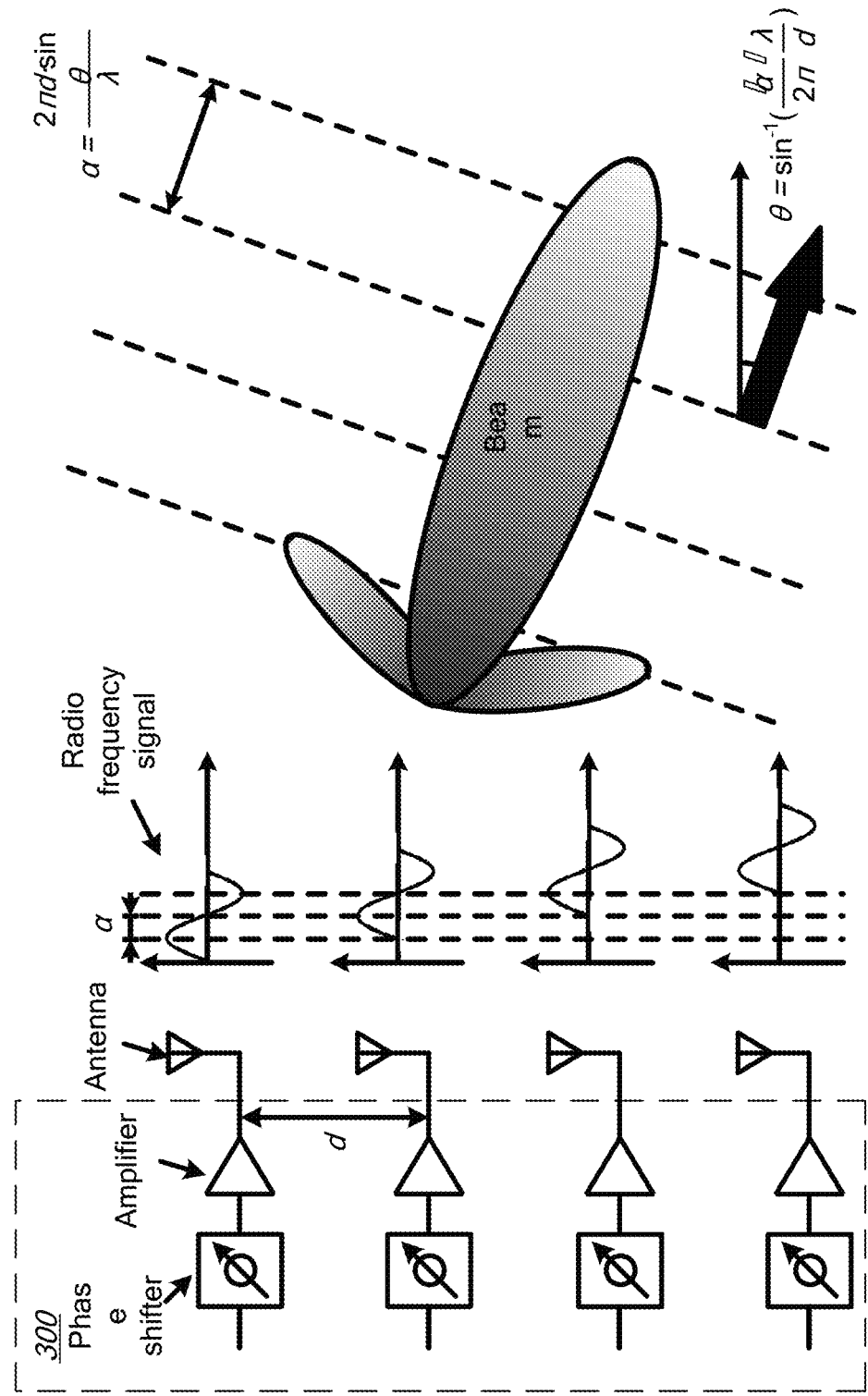
FIG. 3 is a schematic diagram of a principle of a phased-array system.

As shown in FIG. 3, a phased-array system 300 includes multiple transmit channels. Antennas corresponding to all the transmit channels are arranged at an equal distance d as a linear array, and a phase difference between input radio frequency signals of adjacent antennas is α. In this case, a beam angle (that is, an included angle between an antenna beam for transmitting a radio frequency signal and a normal line of an antenna array) may be determined according to the following formula:

$$\theta = \sin^{-1}\left(\frac{\alpha}{2\pi}\frac{\lambda}{d}\right) \quad (1)$$

where λ is a wavelength of a carrier of a transmit signal.

In the phased-array system 300, each transmit channel includes an independently controlled phase shifter, and controls the phase difference α between the radio frequency signals by using the phase shifter. A minimum phase-shift degree of the phase shifter is phase-shift resolution, and a minimum phase-shift degree of the beam angle θ is scanning resolution.

It can be learned from formula (1) that a conversion relationship between the scanning resolution and the phase-shift resolution is related to the distance d between adjacent antennas, as shown in formula (2):

$$\alpha = \frac{2\pi d \cdot \sin \theta}{\lambda} \quad (2)$$

It can be learned from formula (1) that when the phase-shift resolution of the phased-array system 300 is fixed (that is, the phase difference α remains unchanged), the scanning resolution can be improved (that is, the beam angle θ is decreased) by increasing the distance d between adjacent antennas. Higher scanning resolution indicates a larger transmission radius of the phased-array system 300. It can be learned that improving the phase-shift resolution (that is, decreasing the phase difference α) of the phased-array system 300 can effectively increase the transmission radius and reduce the distance d between adjacent antennas. Therefore, a phase shifter with high phase-shift resolution is a key component for implementing a miniaturized phased-array system 400 with high scanning resolution. Conversely, a phase shifter with low phase-shift resolution may require the phased-array system 300 to improve the scanning resolution, the distance d needs to be increased, and this leads to an increase in volume. Therefore, the phase shifter with low phase-shift resolution is not suitable to a miniaturized mobile device.

Figure 4A:
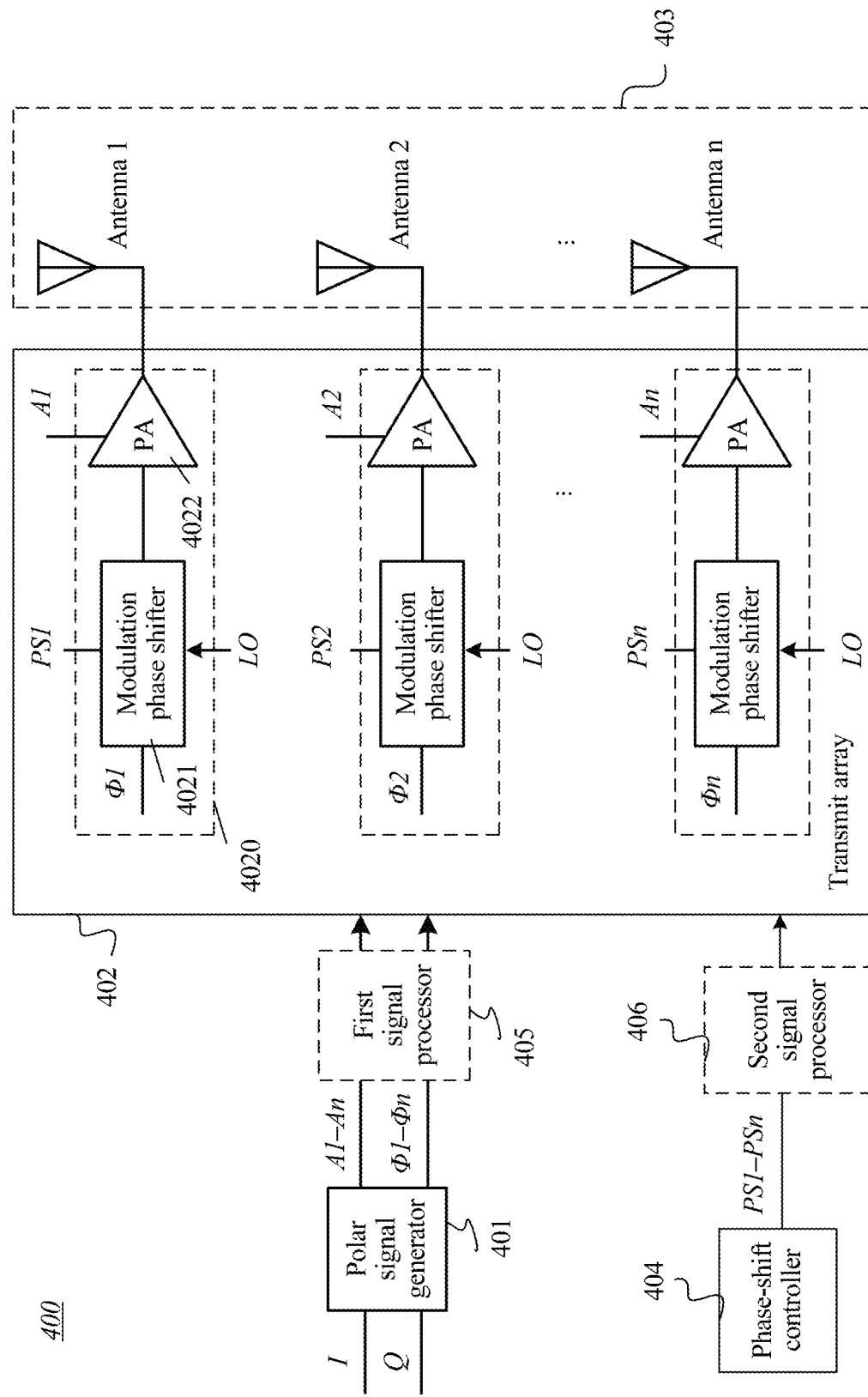
FIG. 4a is a schematic structural diagram of a polar phased-array transmitter according to an embodiment of the present application.

As shown in FIG. 4a, FIG. 4a is a schematic architectural diagram of a polar phased-array transmitter 400 according to an embodiment of the present application. The polar phased-array transmitter 400 includes a polar signal generator 401 and a transmit array 402.

The polar signal generator 401 is configured to perform quadrature-to-polar conversion on in-phase and quadrature baseband signals (respectively indicated by I and Q) to generate n amplitude signals (respectively indicated by A1-An) and n phase signals (respectively indicated by Φ1-Φn), where n is a natural number greater than 1.

Specifically, the polar signal generator 401 may convert the in-phase and quadrature baseband signals into the phase signals and the amplitude signals according to the following formula (3):

$$A = \sqrt{I^2 + Q^2}, \Phi = \tan^{-1}\left(\frac{Q}{I}\right) \quad (3)$$

where I indicates an in-phase signal, Q indicates a quadrature signal, A indicates an amplitude signal, Φ indicates a phase signal, phases of the n phase signals may be the same or different, and amplitudes of the n amplitude signals may also be the same or different.

The transmit array 402 is coupled to the polar signal generator 401. The transmit array 402 is an array including n transmit channels 4020. Each transmit channel 4020 corresponds to one amplitude signal in the n amplitude signals and one phase signal in the n phase signals. The n transmit channels 4020 are configured to: respectively receive the n phase signals, and perform phase modulation and phase shifting on the n phase signals by using a local oscillator signal under control of n phase-shift control signals (respectively indicated by PS1-PSn) to obtain n phase modulation signals. Each transmit channel 4020 corresponds to one phase-shift control signal, and the n transmit channels 4020 respectively performs amplitude modulation and power amplification on the n phase modulation signals by using the n amplitude signals to obtain n radio frequency signals. Different transmit channels receive different phase signals and different amplitude signals. Each transmit channel 4020 performs phase shifting on one phase signal under control of one phase-shift control signal. The n phase-shift control signals are independent of each other. Therefore, each of the transmit channels 4020 independently performs phase shifting.

For example, a transmit channel 1 corresponds to a phase signal Φ1 and an amplitude signal A1, a transmit channel 2 corresponds to a phase signal Φ2 and an amplitude signal A2, and by analogy, a transmit channel n corresponds to a phase signal Φn and an amplitude signal An. Correspondingly, a phase-shift control signal PS1 controls the transmit channel 1, a phase-shift control signal PS2 controls the transmit channel 2, and by analogy, a phase-shift control signal PSn controls the transmit channel n. In the n phase modulation signals obtained after phase modulation and phase shifting separately performed by the n transmit channels, a phase difference between any two phase modulation signals whose phases are adjacent is α. That is, phase values of the n phase modulation signals form an arithmetic progression, and a common difference of the progression is the phase difference α. For example, an angle of phase shifting performed by the transmit channel 1 on the phase signal Φ1 is α, an angle of phase shifting performed by the transmit channel 2 on the phase signal Φ2 is 2α, an angle of phase shifting performed by a transmit channel 3 on a phase signal Φ3 is 3α, and so on. Certainly, it may also be that the angle of phase shifting performed by the transmit channel 1 on the phase signal Φ1 is α, the angle of phase shifting performed by the transmit channel 2 on the phase signal Φ2 is 3α, the angle of phase shifting performed by the transmit channel 3 on the phase signal Φ3 is 5α and so on may be any value ranging from 0° to 360°, and may be adjusted in actual application according to a performance requirement of the polar phased-array transmitter 400.

In an embodiment of the present application, the n transmit channels 4020 in the transmit array 402 may be integrated in a chip. Further, the polar signal generator 401 and the transmit array 402 may also be integrated in a chip.

Figure 4B:
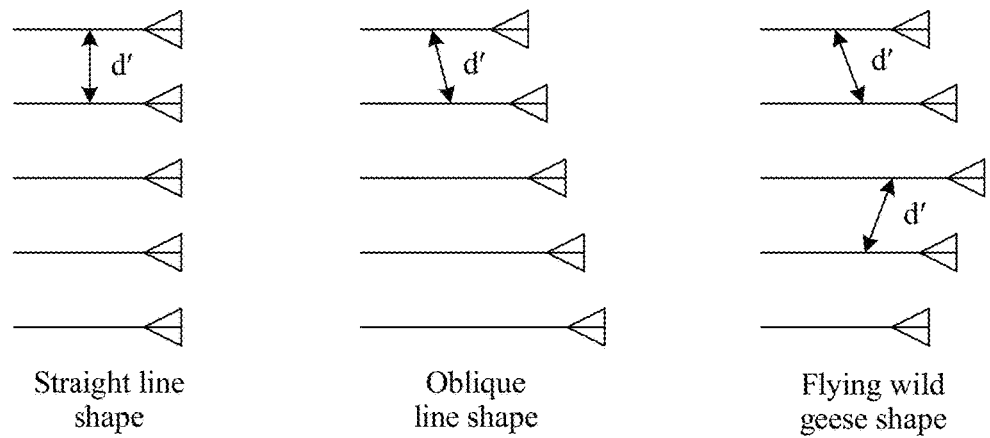
FIG. 4b is a schematic structural diagram of an antenna array in a polar phased-array transmitter according to an embodiment of the present application.

Further, the polar phased-array transmitter 400 may further include an antenna array 403. The antenna array 403 includes n antennas arranged at an equal distance. The n antennas are coupled to power amplifiers in the n transmit channels in a one-to-one manner. The n antennas are configured to: respectively receive the n radio frequency signals generated by the n transmit channels, and transmit the n radio frequency signals based on a beamforming technology. It should be noted that, as shown in FIG. 4b, the n antennas may be arranged in a straight line, an oblique line, a flying wild geese shape, or a circular shape (not shown herein). A specific arrangement form may be flexibly set according to the performance requirement of the polar phased-array transmitter 400 and a structure of a corresponding receiving system. For details, refer to the prior art. A distance (d' in the figure indicates a distance between adjacent antennas in an arrangement direction) between any two adjacent antennas in the arrangement direction roughly remains unchanged.

In the polar phased-array transmitter 400 provided in this embodiment, the n transmit channels each can independently perform phase shifting under the control of the n phase-shift control signals. Therefore, a phase of a radio frequency signal output by each transmit channel can be adjusted in a range from 0° to 360°, thereby meeting a beamforming requirement. Particularly, when the polar phased-array transmitter 400 is integrated in a chip, because the antenna distance d' is generally small, according to a principle of the phased-array system shown in FIG. 3 and formula (1), it can be learned that using the polar phased-array transmitter 400 provided in this embodiment of the present application can improve scanning resolution by improving phase-shift resolution (that is, decreasing the phase difference α) when the antenna distance d' in the antenna array is small. Therefore, the polar phased-array transmitter 400 provided in this embodiment can be applied to various miniaturized devices such as a mobile terminal.

In this embodiment, specifically, as shown in FIG. 4a, each transmit channel 4020 in the transmit array 402 may include: a modulation phase shifter 4021 and a power amplifier (PA) 4022. The modulation phase shifter 4021 in each transmit channel 4020 is configured to: receive a first phase signal (for example, Φ1) corresponding to the transmit channel 4020 from the n phase signals (Φ1-Φn) generated by the polar signal generator 401, receive a local oscillator signal LO from a local oscillator (not shown in the figure), and perform phase modulation and phase shifting on the received first phase signal by using the local oscillator signal LO under control of a first phase-shift control signal (for example, PS1) corresponding to the transmit channel 4020 to obtain a first phase modulation signal. The power amplifier 4022 is configured to: receive a first amplitude signal (for example, A1) corresponding to the transmit channel 4020 from the n amplitude signals (A1-An) generated by the polar signal generator 401, and perform, according to the received first amplitude signal A1, amplitude modulation and power amplification on the first phase modulation signal generated by the modulation phase shifter 4021, so as to obtain a first radio frequency signal. It should be noted that the first amplitude signal, the first phase signal, the first phase-shift control signal, the first phase modulation signal, and the first radio frequency signal described herein are only for convenience of description. When a current transmit channel is the transmit channel 1, the first amplitude signal and the first phase signal are respectively the amplitude signal A1 and the phase signal Φ1 corresponding to the transmit channel 1. When the current transmit channel is the transmit channel 2, the first amplitude signal and the first phase signal are respectively the amplitude signal A2 and the phase signal Φ2 corresponding to the transmit channel 2, and so on. In addition, hardware structures of all channels in FIG. 4a are the same, and mutual reference may be made to each other. For brief description, not all the transmit channels are shown herein.

Figure 4C:
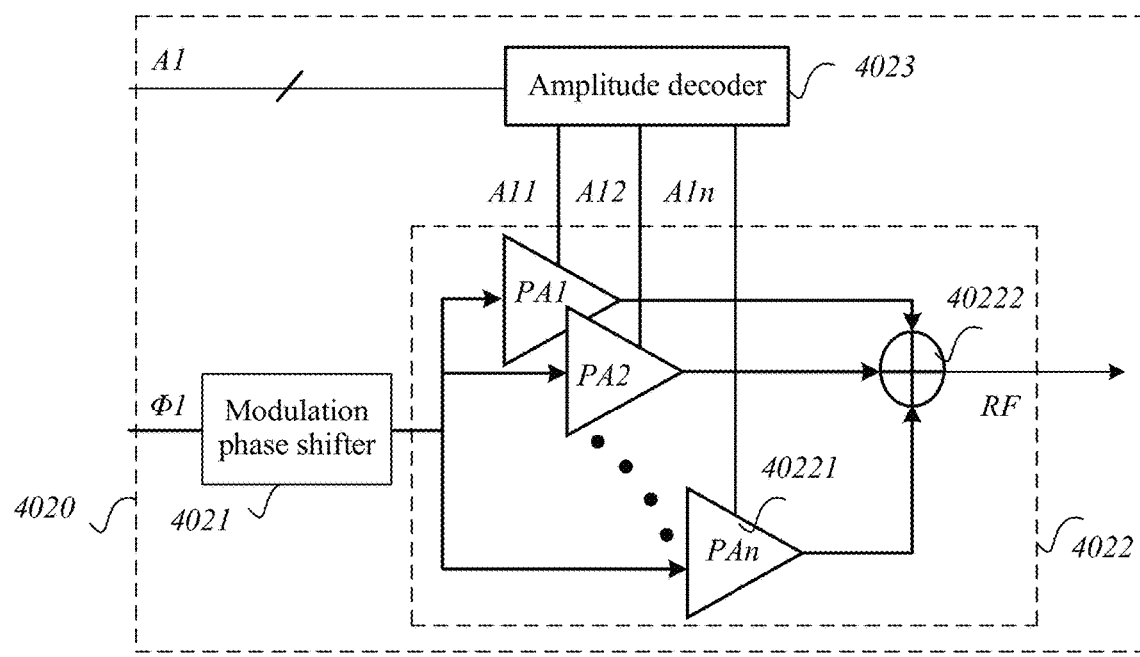
FIG. 4c is a schematic structural diagram of a power amplifier including multiple digital power amplifiers according to an embodiment of the present application.

For example, as shown in FIG. 4c, the power amplifier 4022 may include a PA array including multiple digital PAs 40221 (that is, PA1, PA2, . . . , PAn shown in the figure) arranged in parallel, and a signal power combiner 40222 separately coupled to the multiple digital PAs 40221. Each transmit channel 4020 may further include an amplitude decoder 4023. The amplitude decoder 4023 is configured to: decode a first amplitude signal A1 corresponding to the transmit channel 4020 to obtain multiple decoded amplitude signals (indicated by A11-A1n), and control switch statuses of the multiple digital power amplifiers in the PA 4022 by using the multiple decoded amplitude signals (A11-A1n), that is, control a quantity of digital power amplifiers that are switched on in the PA array including the multiple digital power amplifiers, thereby controlling a gain of the first phase modulation signal that is input to the power amplifier 4022, and implementing amplitude modulation and power amplification. Then the signal power combiner 40222 combines first phase modulation signals obtained after amplitude modulation and power amplification performed by the multiple digital PAs 40221 into a first radio frequency signal RF, and outputs the first radio frequency signal.

A person skilled in the art should know that switch-mode PAs (including a class D PA, a class E PA, a class $D^{-1}$ PA, and the like) generally have higher efficiency but poorer linearity. In the polar phased-array transmitter 400 provided in this embodiment of the present application, a phase path (that is, a transmission path of the phase signals) and an amplitude path (that is, a transmission path of the amplitude signals) are separated from each other, and a balance between efficiency and linearity can be stricken. Therefore, the multiple digital PAs 40221 in the power amplifier 4022 may be PAs with high efficiency but poor linearity, for example, the switch-mode PAs (including the class D PA, the class E PA, the class $D^{-1}$ PA, and the like). In addition to implementing high efficiency, a PA may be controlled by using a digital amplitude signal to support a high peak-to-average power ratio (PAPR) signal.

Further, in an embodiment of the present application, as shown in FIG. 4a, the polar phased-array transmitter 400 may further include a first signal processor 405. The first signal processor 405 is separately coupled to the polar signal generator 401 and the transmit array 402. The first signal processor 405 is configured to separately perform digital predistortion (DPD) processing on the n amplitude signals and the n phase signals generated by the polar signal generator 401 to reduce an amplitude error caused by non-linearity to each of the amplitude signals and reduce a phase error caused by non-linearity to each of the phase signals, and then respectively provide the n transmit channels in the transmit array 402 with the n phase signals and the n amplitude signals obtained after the DPD processing. It should be noted that an excessively high PAPR may affect linearity of the power amplifier 4022, and distortion generated when the power amplifier 4022 operates in a non-linear region can be reduced by digital predistortion, thereby greatly improving efficiency of the power amplifier 4022.

Figure 2:
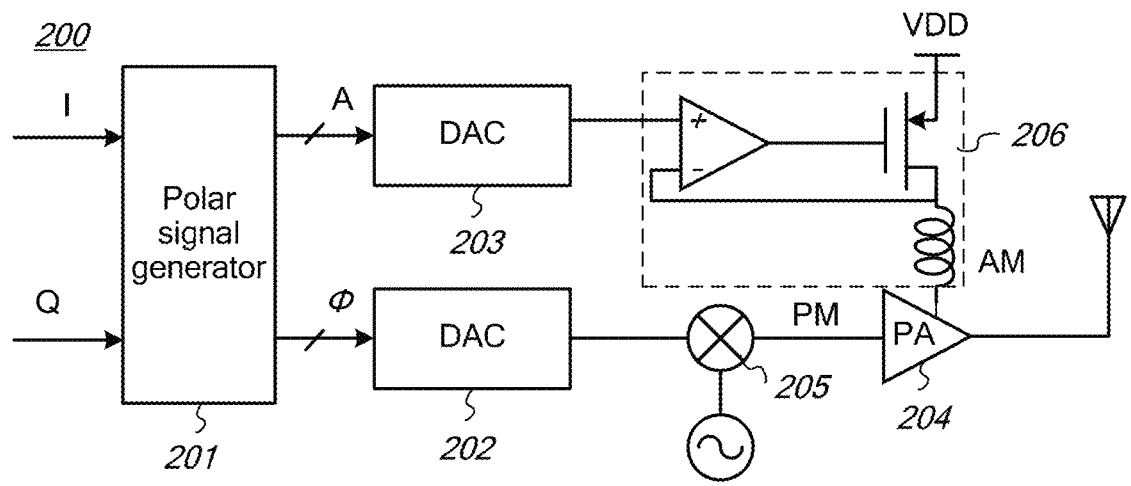
FIG. 2 is a schematic architectural diagram of a polar transmitter in the prior art.

For example, the power amplifier 4022 may also be an analog power amplifier. For details, refer to the PA 204 in FIG. 2. It should be noted that in this embodiment, both an amplitude signal and a phase signal corresponding to each transmit channel 4020 are signals in a digital domain. Therefore, when the power amplifier 4022 is an analog power amplifier, digital-to-analog conversion needs to be separately performed on the first amplitude signal and the first phase modulation signal that are input to the power amplifier 4022. Then the power amplifier 4022 combines, in an analog domain, the first amplitude signal and the first phase modulation signal obtained after the digital-to-analog conversion into a first radio frequency signal.

In an embodiment of the present application, the modulation phase shifter 4021 may specifically include: a phase modulator (phase modulator) and a phase shifter (phase shifter). The modulation phase shifter 4021 may first perform phase shifting and then phase modulation, or first perform phase modulation and then phase shifting. A sequence of phase modulation and phase shifting may be flexibly set according to an actual requirement.

Figure 5A:
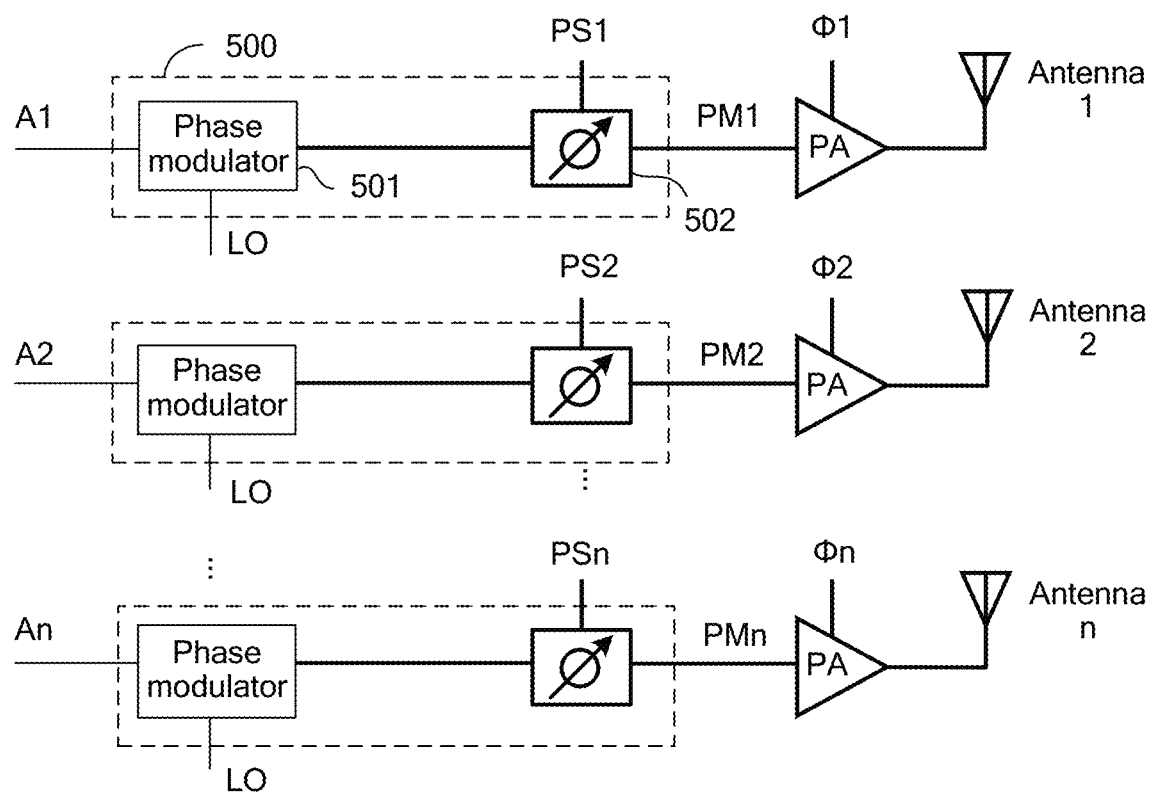
FIG. 5a is a schematic architectural diagram of a modulation phase shifter according to an embodiment of the present application.

For example, as shown in FIG. 5a, a modulation phase shifter 500 may include: a phase modulator 501 and a phase shifter 502 coupled to the phase modulator 501. The phase modulator 501 is configured to: separately receive the first phase signal Φ1 and the local oscillator signal LO, and perform phase modulation on the first phase signal Φ1 by using the local oscillator signal LO. Then the phase shifter 502 is configured to: perform, under the control of the first phase-shift control signal PS1, phase shifting on the first phase signal Φ1 modulated by the phase modulator 501 to obtain a first phase modulation signal PM1, and then send the first phase modulation signal PM1 to a subsequent PA for amplification processing. For specific amplification processing, refer to FIG. 4a to FIG. 4c and the foregoing description, and details are not described herein again.

Figure 5B:
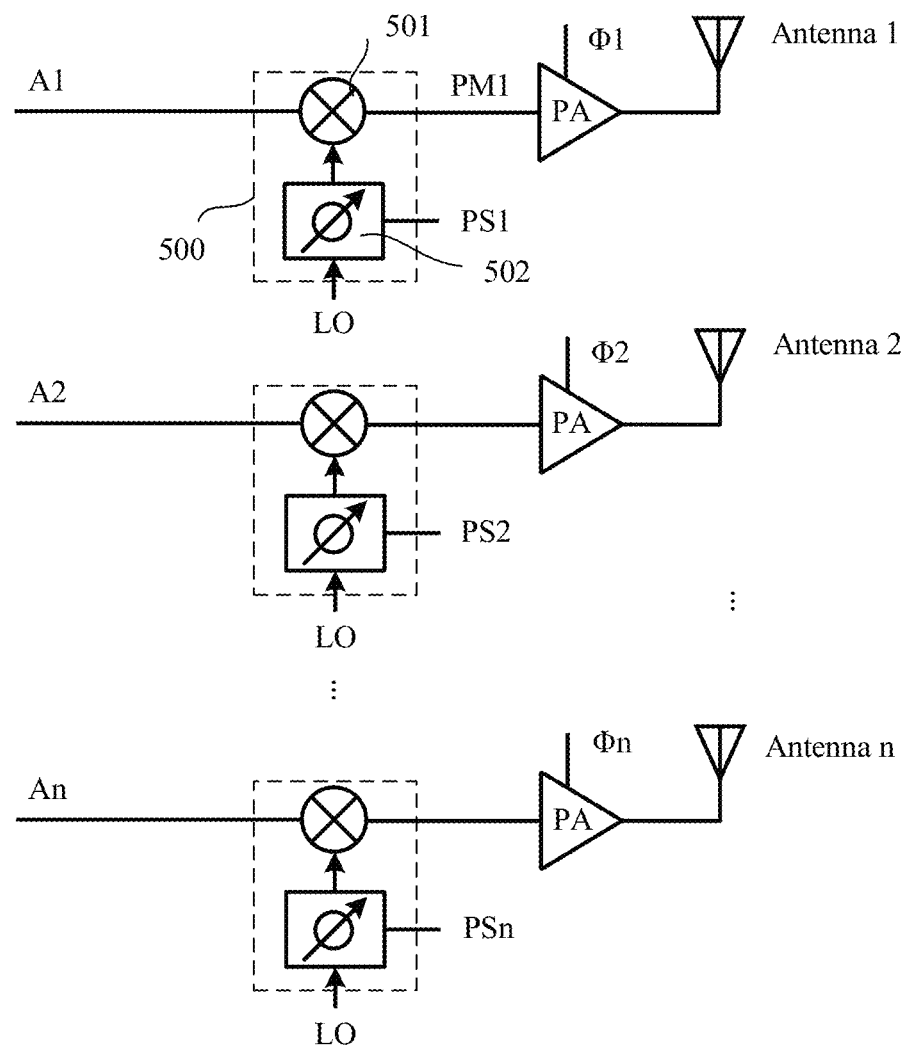
FIG. 5b is a schematic architectural diagram of another modulation phase shifter according to an embodiment of the present application.

For example, as shown in FIG. 5b, the modulation phase shifter 500 may also include: a phase modulator 501 and a phase shifter 502 coupled to the phase modulator 501. The phase shifter 502 is configured to: receive the local oscillator signal LO and the first phase-shift control signal PS1, and perform phase shifting on the local oscillator signal under the control of the first phase-shift control signal PS1. The phase modulator 501 is configured to: receive the first phase signal Φ1, and perform phase modulation on the first phase signal Φ1 by using the local oscillator signal obtained after the phase shifting, so as to generate a first phase modulation signal PM1.

In an embodiment of the present application, as shown in FIG. 4a, the polar phased-array transmitter 400 may further include a phase-shift controller 404, configured to generate the n phase-shift control signals (PS1-PSn), so as to independently control modulation phase shifters in the n transmit channels by using the n phase-shift control signals.

In an embodiment of the present application, further, the polar phased-array transmitter 400 may include a second signal processor 406. The second signal processor 406 is separately coupled to the phase-shift controller 404 and the transmit array 402. The second signal processor 406 is configured to: separately perform digital predistortion processing on the n phase-shift control signals generated by the phase-shift controller 404, so as to reduce respective errors of the n phase-shift control signals; and respectively provide the transmit channels in the transmit array 402 with the n phase-shift control signals obtained after the digital predistortion processing, thereby implementing independent calibration of the phase shifter in the modulation phase shifter 4021. The modulation phase shifter 4021 is disposed in the phase path, the phase path is independent of the amplitude path, and an output amplitude of the polar phased-array transmitter 400 is mainly determined by an amplitude signal controlling the power amplifier 4022. Therefore, phase error calibration performed on the phase shifter in the modulation phase shifter 4021 has extremely small impact on the output amplitude of the polar phased-array transmitter 400. In addition, after the phase shifter is calibrated, higher phase-shift resolution can be implemented, and this helps to improve the scanning resolution of the polar phased-array transmitter 400.

Figure 6:
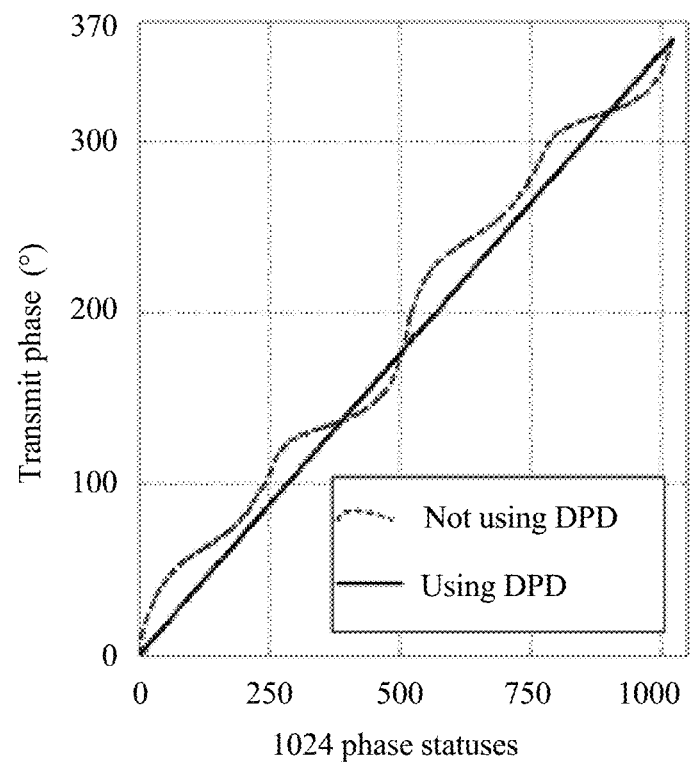
FIG. 6 is a diagram of a test on a relationship between a transmit out phase and a phase status of a polar phased-array transmitter according to an embodiment of the present application.
Figure 7:
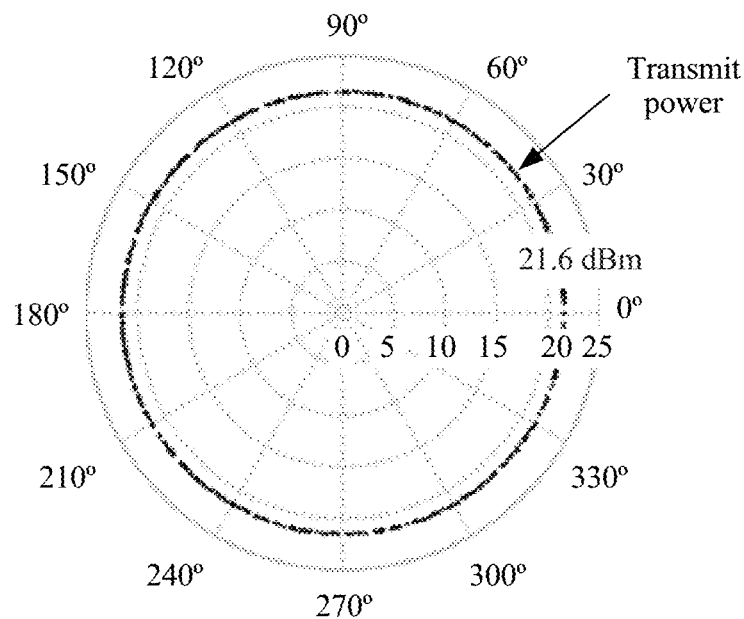
FIG. 7 is a polar diagram of phase and power changes of a polar phased-array transmitter according to an embodiment of the present application.

FIG. 6 shows a result of a test on a polar phased-array transmitter 400 that does not use digital predistortion and one that uses digital predistortion in an example of a 10-bit (corresponding to 1024 ($2^{10}$) phase statuses) phase-shift control signal. It can be learned that, when the second signal processor 406 is not used to perform digital predistortion, non-linearity of a curve (reflecting performance of the power amplifier 4022) in terms of a transmit phase versus a phase status is significantly enhanced. After error calibration is performed on the phase-shift control signal by using DPD, a curve in terms of the transmit phase versus the phase status features good linearity and is even almost consistent with a theoretical curve. In addition, after the second signal processor 406 performs digital predistortion on the n phase-shift control signals, phase-shift resolution of the polar phased-array transmitter 400 reaches 3.5°. Therefore, the performance of the power amplifier 4022 may be significantly improved, and the scanning resolution of the polar phased-array transmitter 400 may be improved. In addition, a root-mean-square (RMS) phase/amplitude error obtained after digital predistortion is less than 0.3°/0.2 dB, and may also meet a performance requirement of a wireless communications system for a low phase/amplitude error. FIG. 7 shows a polar diagram of phase and power changes obtained by testing the polar phased-array transmitter 400 that uses the second signal processor 406 to perform digital predistortion. It can be learned from FIG. 7 that transmit powers of the polar phased-array transmitter 400 in all phases are relatively balanced, and good stability is maintained between the transmit channels.

Figure 8A:
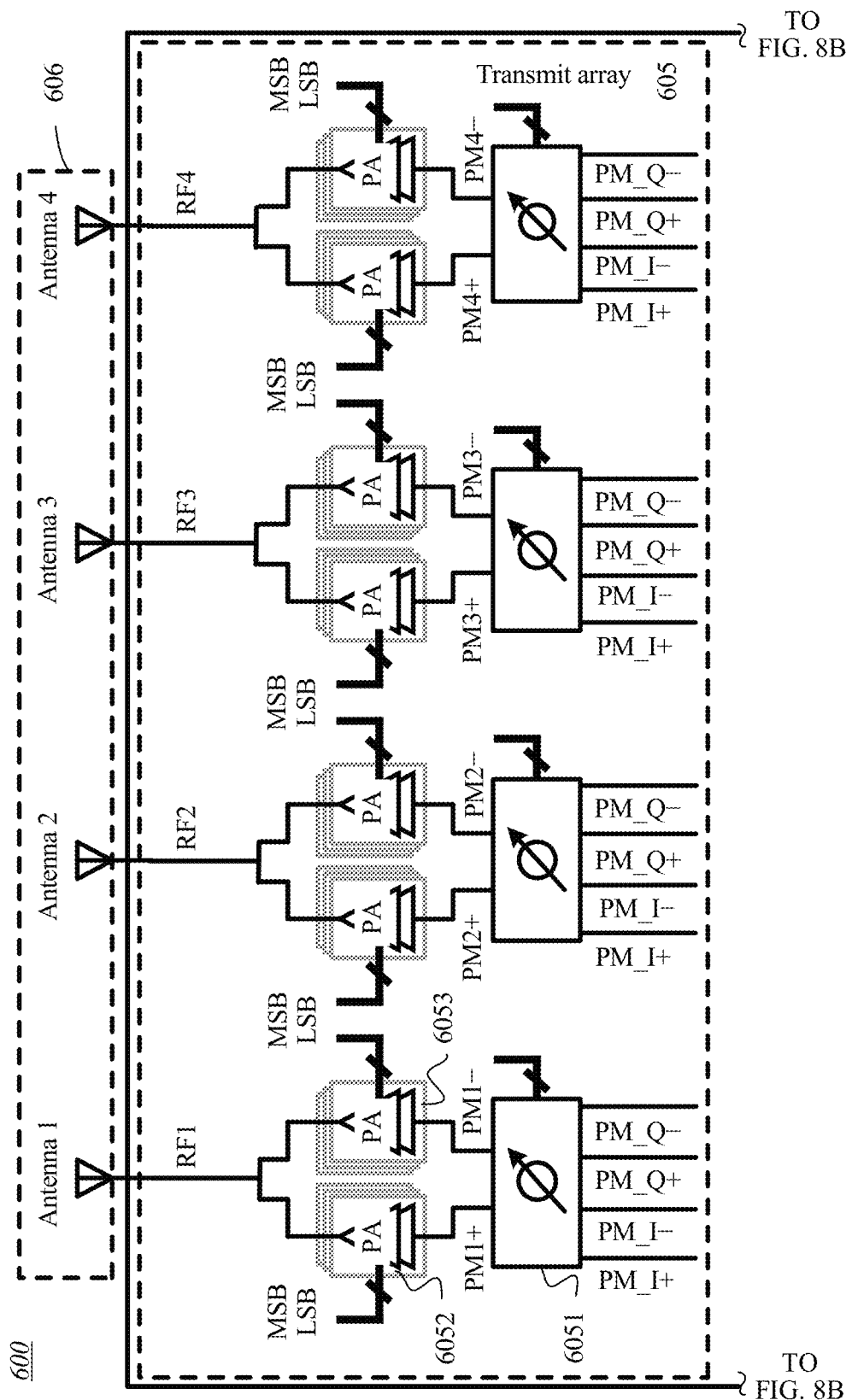
FIG. 8A and FIG. 8B are a schematic structural diagram of a chip integrated with a polar phased-array transmitter according to an embodiment of the present application.
Figure 8B:
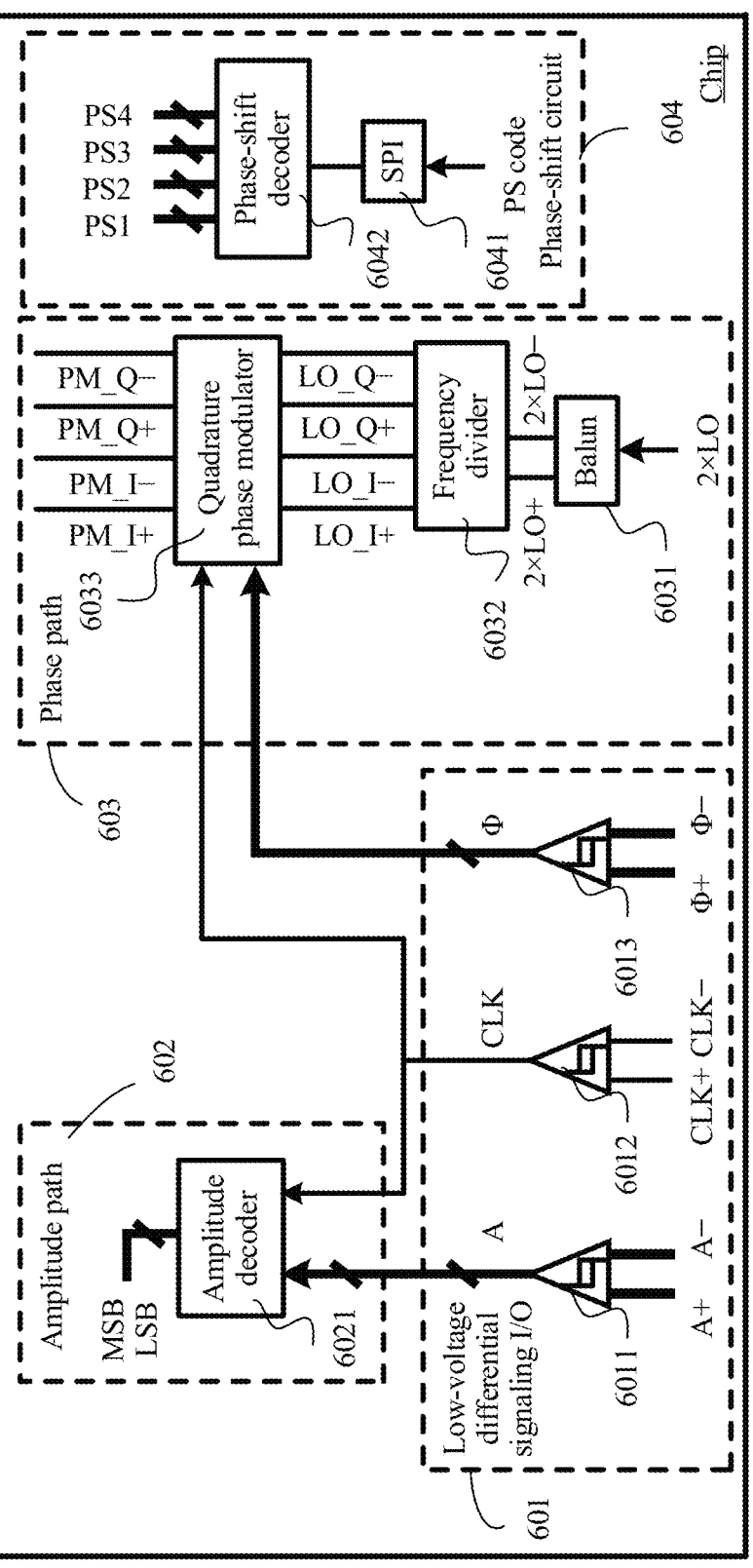

As shown in FIG. 8A and FIG. 8B, an embodiment of the present application further provides a chip 600 integrated with a polar phased-array transmitter. For ease of description, FIG. 8A and FIG. 8B show a structure of a chip integrated with only a 4-element digital modulated polar phased-array transmitter. A person skilled in the art should know that the chip 600 may be integrated with any multi-element digital modulated polar phased-array transmitter according to a transmit requirement. Therefore, the chip 600 provided in this embodiment of the present application is not limited to being integrated with the 4-element digital modulated polar phased-array transmitter. It should be noted that mutual reference may be made between an architecture of the polar phased-array transmitter in FIG. 8A and FIG. 8B and that of the polar phased-array transmitter shown in FIG. 4a to FIG. 4c.

According to signal processing logic, the chip 600 may be divided into: a low-voltage differential signaling (Low-Voltage Differential Signaling, LVDS) input/output interface (I/O) 601, an amplitude path 602, a phase path 603, a phase-shift circuit 604, and a transmit array 605.

The low-voltage differential signaling I/O 601 is configured to: generate an amplitude signal A and a phase signal Φ respectively according to differential amplitude signals (A+, A−) and differential phase signals (Φ+, Φ−) provided by a polar signal generator (not shown in the figure), and generate a clock signal CLK according to differential system clock signals (CLK+, CLK−).

The amplitude path 602 is configured to generate a segmented thermometer code (thermometer code) based on the clock signal CLK and the amplitude signal A. The segmented thermometer code includes: the least significant bit (LSB) and the most significant bit (MSB).

The phase path 603 is configured to perform quadrature phase modulation on the phase signal Φ based on the clock signal CLK by using a local oscillator signal to obtain n first phase modulation signals, where n is a natural number greater than 1. The amplitude path 602 and the phase path 603 perform signal processing based on a same clock signal CLK to implement time synchronization. The figure shows four first phase modulation signals, indicated by PM_I+, PM_I−, PM_Q+, and PM_Q− respectively. A person skilled in the art should know that PM_I+ and PM_I− are a pair of differential signals, where I indicates an in-phase component, and similarly, Q indicates a quadrature component.

The phase-shift circuit 604 is configured to: receive a phase-shift control code (PS code) generated by a phase-shift controller (not shown), and generate n phase-shift control signals according to the phase-shift control code (PS code). The figure shows four phase-shift control signals, indicated by PS1, PS2, PS3, and PS4 respectively.

The transmit array 605 includes n transmit channels. The n transmit channels respectively perform phase shifting on the n first phase modulation signals under control of the n phase-shift control signals to obtain n groups of second phase modulation signals. Each group of second phase modulation signals includes two differential second phase modulation signals. The n transmit channels are further configured to respectively perform amplitude modulation and power amplification on the n groups of second phase modulation signals under control of the segmented thermometer code to obtain n radio frequency signals. In the figure, four radio frequency signals are indicated by RF1, RF2, RF3, and RF4 respectively, four groups of second phase modulation signals are indicated by (PM1+, PM1−), (PM2+, PM2−), (PM3+, PM3−), and (PM4+, PM4−) respectively, and two differential second phase modulation signals are indicated by PM1+ and PM1−. Others indications are similar, and details are not described herein again.

FIG. 8A and FIG. 8B further show an antenna array 606 coupled to the chip 600. The antenna array includes n antennas. The n antennas are coupled to the n transmit channels in the chip in a one-to-one manner. The n antennas are arranged at an equal distance to send the n radio frequency signals in a beamforming manner. For a specific arrangement form of the antenna array, refer to FIG. 4b and the corresponding description, and details are not described herein again.

Specifically, the low-voltage differential signaling I/O 601 may include: a first LVDS receiver 6011, a second LVDS receiver 6013, and a third LVDS receiver 6012. The first LVDS receiver 6011 is configured to: receive the differential amplitude signals (A+, A−), and generate the amplitude signal A. The second LVDS receiver 6013 is configured to: receive the differential phase signals (Φ+, Φ−), and generate the phase signal Φ. The third LVDS receiver 6012 is configured to: receive the differential system clock signals (CLK+, CLK−), and generate the clock signal CLK. The differential amplitude signals (A+, A−) and the differential phase signals (Φ+, Φ−) may be obtained after quadrature-to-polar conversion performed by the polar signal generator on a quadrature baseband signal. The differential system clock signals (CLK+, CLK−) may be provided by a clock generator or a system clock bus.

The amplitude path 602 may include: an amplitude decoder 6021, configured to generate the segmented thermometer code based on the clock signal CLK by using the amplitude signal A. It should be noted that in an embodiment of the present application, using a segmented thermometer code to control a digital power amplifier array in a transmit array to perform amplitude modulation and power amplification aims to reduce a quantity of PAs in the digital power amplifier array, thereby reducing circuit complexity. For the 4-element digital modulated polar phased-array transmitter, the digital power amplifier array may require 1023 PAs when segmented control is not performed. For details, refer to the prior art.

The phase path 603 may include: a single-end to differential balun 6031, configured to covert a local oscillator signal at twice frequency (2×LO) into differential local oscillator signals (2×LO+ and 2×LO−); a quadrature output frequency divider 6032, configured to perform frequency-halving on the differential local oscillator signals (2×LO+ and 2×LO−) to obtain four quadrature local oscillator signals (LO_I+, LO_I−, LO_Q+, and LO_Q−); and a quadrature phase modulator 6033, configured to perform phase modulation on the phase signal Φ based on the clock signal CLK by using the four quadrature local oscillator signals (LO_I+, LO_I−, LO_Q+, and LO_Q−) to obtain the four first phase modulation signals (PM_I+, PM_I−, PM_Q+, and PM_Q−).

The phase-shift circuit 604 may include: a serial peripheral interface (serial peripheral interface, SPI) 6041, configured to: receive one phase-shift control code (PS code) from the phase-shift controller (not shown in the figure), and obtain four pieces of PS code by means of serial-to-parallel conversion; and a phase-shift decoder 6042, configured to decode the four pieces of PS code that are obtained by means of conversion by the SPI 6041 to generate four phase-shift control signals (PS1, PS2, PS3, and PS4).

Figure 1:
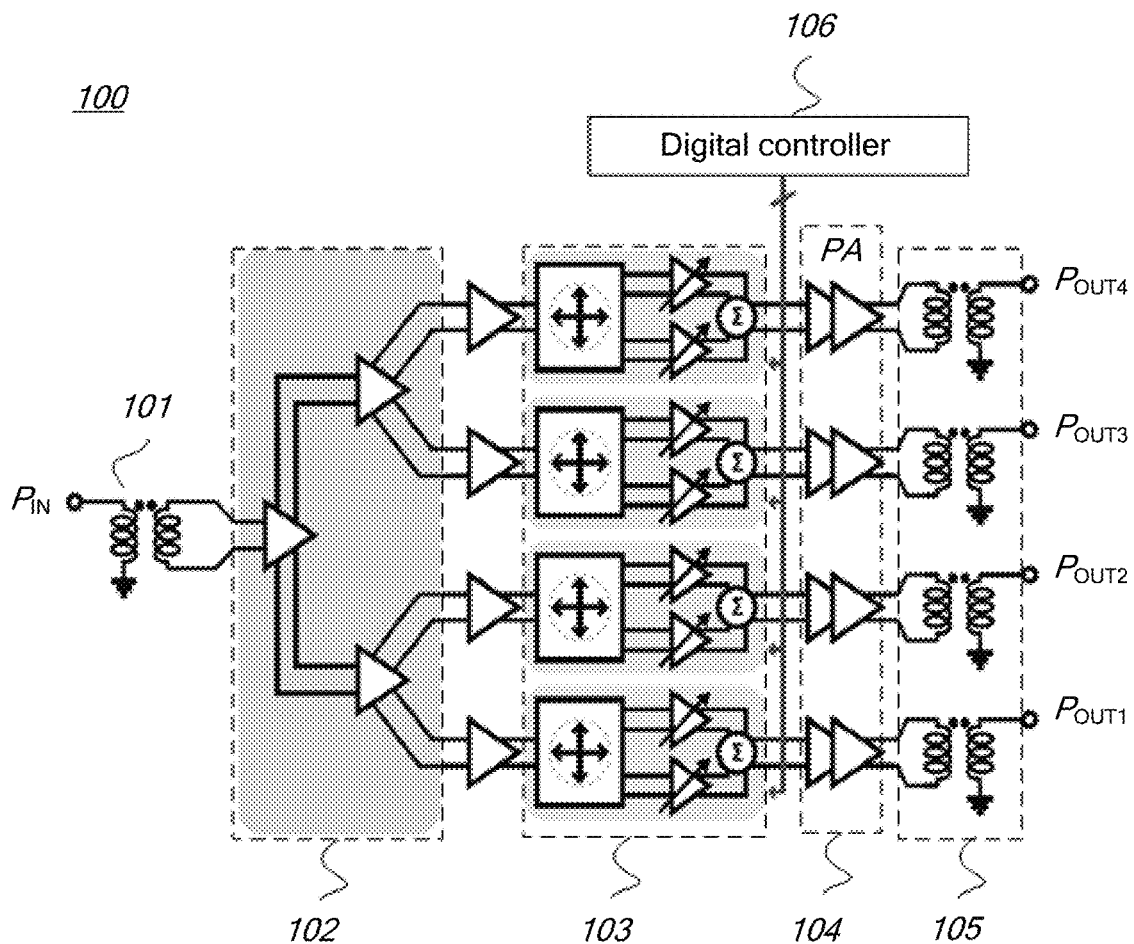
FIG. 1 is a schematic structural diagram of a phased-array transmitter in the prior art.

Each transmit channel in the transmit array 605 may include: a digital phase shifter 6051, a first digital power amplifier array 6052, and a second digital power amplifier array 6053. The digital phase shifter 6051 is configured to obtain the four first phase modulation signals (PM_I+, PM_I−, PM_Q+, and PM_Q−) from the phase path 603, and perform phase shifting on the four first phase modulation signals (PM_I+, PM_I−, PM_Q+, and PM_Q−) under control of any phase-shift control signal (for example, PS1) in the four phase-shift control signals (PS1, PS2, PS3, and PS4) generated by the phase-shift circuit 604, so as to obtain a group of second phase modulation signals (for example, PM1+ and PM1−). The first digital power amplifier array 6052 and the second digital power amplifier array 6053 separately perform amplitude modulation and power amplification on two differential second phase modulation signals in the group of second phase modulation signals under the control of the segmented thermometer code, to generate a radio frequency signal RF1. Signals obtained after amplitude modulation and power amplification separately performed by the first digital power amplifier array 6052 and the second digital power amplifier array 6053 may be specifically combined into the radio frequency signal RF1 by a matching circuit (not shown herein; for details, refer to the output matching circuit 105 in FIG. 1).

Figure 9:
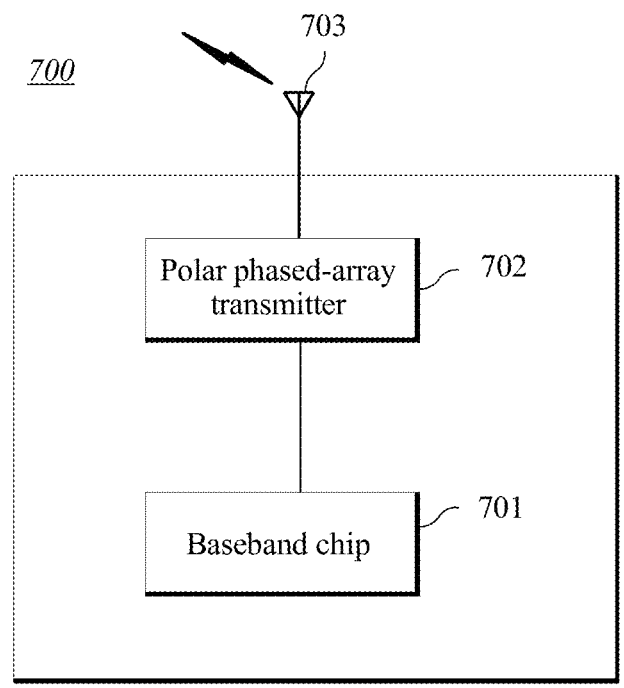
FIG. 9 is a schematic structural diagram of a mobile terminal using a polar phased-array transmitter according to an embodiment of the present application.

As shown in FIG. 9, an embodiment of the present application further provides a mobile terminal 700, including: a baseband chip 701, configured to generate a quadrature digital baseband signal;

a polar phased-array transmitter 702 coupled to the baseband chip 701, configured to: perform quadrature-to-polar conversion on the quadrature digital baseband signal to generate n amplitude signals (A1-An) and n phase signals (Φ1-Φn), where n is a natural number greater than 1; perform phase modulation and phase shifting on the n phase signals (Φ1-Φn) by using a local oscillator signal LO to obtain n phase modulation signals; and perform amplitude modulation and power amplification on the n phase modulation signals by using the amplitude signals (A1-An) to obtain n radio frequency signals; and an antenna array 703 coupled to the polar phased-array transmitter 702, configured to: obtain the n radio frequency signals from the polar phased-array transmitter 702, and transmit the n radio frequency signals based on a beamforming technology.

In this embodiment, the mobile terminal 700 may be a mobile phone, a tablet, a notebook computer, a vehicular device, or the like.

Further, a transmitter having a polar phased-array architecture is used, so that the mobile terminal 700 provided in this embodiment can be a terminal device that uses a polar code for coding, for example, a 5G (fifth generation) mobile communications technology device.

For a structure of the polar phased-array transmitter 702 in this embodiment, refer to the descriptions of the foregoing embodiments and the structures shown in FIG. 4a to FIG. 5b, and details are not described herein again.

In this embodiment, the baseband chip 701 may also be referred to as a baseband processor, a communication processor, a modem (modem), or the like. In addition, with development of an integrated circuit technology, the baseband chip 701 and the polar phased-array transmitter 702 may also be integrated together in the future, for example, integrated with an application processor (AP), an image signal processor (ISP), or the like in a chip to form a System-On-a-Chip (SOC).

A person skilled in the art should be aware that in the foregoing one or more examples, functions described in the present application may be implemented by hardware, software, firmware, or any combination thereof. When the present application is implemented by software, the foregoing functions may be stored in a computer-readable medium or transmitted as one or more instructions or code in the computer-readable medium. The computer-readable medium includes a computer storage medium and a communications medium, where the communications medium includes any medium that enables a computer program to be transmitted from one place to another. The storage medium may be any available medium accessible to a general-purpose or dedicated computer.

The objectives, technical solutions, and benefits of the present application are further described in detail in the foregoing specific embodiments. It should be understood that the foregoing descriptions are merely specific embodiments of the present application, but are not intended to limit the protection scope of the present application. Any modification, equivalent replacement, or improvement made within the principle of the present application shall fall within the protection scope of the present application.

What is claimed is:

1. A polar phased-array transmitter, comprising:
   a polar signal generator, the polar signal generator configured to:
     receive in-phase and quadrature baseband signals; and
     perform quadrature-to-polar conversion on the in-phase and quadrature baseband signals to generate n amplitude signals and n phase signals, wherein n is a natural number greater than 1; and
   a transmit array, wherein the transmit array comprises n transmit channels, each transmit channel corresponds to one amplitude signal in the n amplitude signals and one phase signal in the n phase signals, and wherein the n transmit channels are configured to:
     respectively receive the n phase signals, and respectively perform phase modulation and phase shifting on the n phase signals by using a local oscillator signal under control of n phase-shift control signals to obtain n phase modulation signals, wherein a phase difference between any two phase modulation signals whose phases are adjacent in the n phase modulation signals is $\alpha$, and $\alpha$ ranges from 0° to 360° (including 0° and 360°); and
     respectively perform amplitude modulation and power amplification on the n phase modulation signals by using the n amplitude signals to obtain n radio frequency signals.

2. The polar phased-array transmitter according to claim 1, wherein each transmit channel in the n transmit channels comprises a modulation phase shifter and a power amplifier;
   wherein the modulation phase shifter is configured to:
     receive a first phase signal from the n phase signals generated by the polar signal generator; and
     perform phase modulation and phase shifting on the first phase signal by using the local oscillator signal under control of a first phase-shift control signal corresponding to each transmit channel to obtain a first phase modulation signal; and
   wherein the power amplifier is configured to:
     receive a first amplitude signal from the n amplitude signals generated by the polar signal generator; and
     perform amplitude modulation and power amplification on the first phase modulation signal according to the received first amplitude signal to obtain a first radio frequency signal.

3. The polar phased-array transmitter according to claim 2, wherein each transmit channel further comprises an amplitude decoder, and the power amplifier comprises multiple digital power amplifiers and a signal power combiner;
   wherein the amplitude decoder is configured to:
     decode the first amplitude signal to obtain multiple decoded amplitude signals; and
     control switch statuses of the multiple digital power amplifiers respectively by using the multiple decoded amplitude signals; and
   wherein the signal power combiner combines signals obtained after amplitude modulation and power amplification performed by the multiple digital power amplifiers into the first radio frequency signal, and outputs the first radio frequency signal.

4. The polar phased-array transmitter according to claim 3, wherein the multiple digital power amplifiers are switch-mode power amplifiers.

5. The polar phased-array transmitter according to claim 2, wherein the power amplifier is an analog power amplifier.

6. The polar phased-array transmitter according to claim 2, wherein the modulation phase shifter comprises a phase modulator and a phase shifter coupled to the phase modulator;
   wherein the phase modulator is configured to:
     separately receive the first phase signal and the local oscillator signal; and
     perform phase modulation on the first phase signal by using the local oscillator signal; and
   wherein the phase shifter is configured to perform, under the control of the first phase-shift control signal, phase shifting on the first phase signal modulated by the phase modulator to obtain the first phase modulation signal.

7. The polar phased-array transmitter according to claim 2, wherein the modulation phase shifter comprises a phase modulator and a phase shifter coupled to the phase modulator;
   wherein the phase shifter is configured to:
     receive the local oscillator signal and the first phase-shift control signal; and
     perform phase shifting on the local oscillator signal under the control of the first phase-shift control signal; and
   wherein the phase modulator is configured to:
     receive the first phase signal; and
     perform phase modulation on the first phase signal by using the local oscillator signal obtained after phase shifting performed by the phase shifter to generate the first phase modulation signal.

8. The polar phased-array transmitter according to claim 1, wherein the polar phased-array transmitter further comprises a first signal processor, wherein the first signal processor is separately coupled to the polar signal generator and the transmit array; and
   wherein the first signal processor is configured to separately perform digital predistortion processing on the n amplitude signals and the n phase signals generated by the polar signal generator.

9. The polar phased-array transmitter according to claim 8, wherein the polar phased-array transmitter further comprises a phase-shift controller, wherein the phase-shift controller configured to generate the n phase-shift control signals.

10. The polar phased-array transmitter according to claim 9, wherein the polar phased-array transmitter further comprises a second signal processor, wherein the second signal processor is separately coupled to the phase-shift controller and the transmit array, and wherein the second signal processor is configured to separately perform digital predistortion processing on the n phase-shift control signals generated by the phase-shift controller.

11. The polar phased-array transmitter according to claim 1, wherein the polar phased-array transmitter further comprises an antenna array, wherein the antenna array comprises n antennas arranged at an equal distance, the n antennas are coupled to the n transmit channels in a one-to-one manner, and the n antennas are configured to respectively receive the n radio frequency signals generated by the n transmit channels and transmit the n radio frequency signals.

12. A mobile terminal, comprising: a baseband chip, a polar phased-array transmitter, and an antenna array, wherein:
the baseband chip is configured to generate an in-phase and quadrature digital baseband signal;
the polar phased-array transmitter comprising:
a polar signal generator, the polar signal generator configured to:
receive the in-phase and quadrature baseband signals; and
perform quadrature-to-polar conversion on the in-phase and quadrature baseband signals to generate n amplitude signals and n phase signals, wherein n is a natural number greater than 1; and
a transmit array, wherein the transmit array comprises n transmit channels, wherein the n transmit channels are configured to:
separately perform phase modulation and phase shifting on the n phase signals by using a local oscillator signal to obtain n phase modulation signals; and
perform amplitude modulation and power amplification on the n phase modulation signals by using the amplitude signals to obtain n radio frequency signals; and
the antenna array is configured to:
obtain the n radio frequency signals from the polar phased-array transmitter; and
transmit the n radio frequency signals.

13. The mobile terminal according to claim 12, wherein each transmit channel in the n transmit channels comprises a modulation phase shifter and a power amplifier;
wherein the modulation phase shifter is configured to:
receive a first phase signal from the n phase signals generated by the polar signal generator; and
perform phase modulation and phase shifting on the first phase signal by using the local oscillator signal under control of a first phase-shift control signal corresponding to each transmit channel to obtain a first phase modulation signal; and
wherein the power amplifier is configured to:
receive a first amplitude signal from the n amplitude signals generated by the polar signal generator; and
perform amplitude modulation and power amplification on the first phase modulation signal according to the received first amplitude signal to obtain a first radio frequency signal.

14. The mobile terminal according to claim 13, wherein each transmit channel further comprises an amplitude decoder, and wherein the power amplifier comprises multiple digital power amplifiers and a signal power combiner;
wherein the amplitude decoder is configured to:
decode the first amplitude signal to obtain multiple decoded amplitude signals; and
control switch statuses of the multiple digital power amplifiers respectively by using the multiple decoded amplitude signals; and
wherein the signal power combiner combines signals obtained after amplitude modulation and power amplification performed by the multiple digital power amplifiers into the first radio frequency signal, and outputs the first radio frequency signal.

15. The mobile terminal according to claim 14, wherein the multiple digital power amplifiers are switch-mode power amplifiers.

16. The mobile terminal according to claim 13, wherein the power amplifier is an analog power amplifier.

17. The mobile terminal according to claim 13, wherein the modulation phase shifter comprises a phase modulator and a phase shifter coupled to the phase modulator;
wherein the phase modulator is configured to:
separately receive the first phase signal and the local oscillator signal; and
perform phase modulation on the first phase signal by using the local oscillator signal; and
wherein the phase shifter is configured to perform, under the control of the first phase-shift control signal, phase shifting on the first phase signal modulated by the phase modulator to obtain the first phase modulation signal.

18. The mobile terminal according to claim 13, wherein the modulation phase shifter comprises a phase modulator and a phase shifter coupled to the phase modulator;
wherein the phase shifter is configured to:
receive the local oscillator signal and the first phase-shift control signal; and
perform phase shifting on the local oscillator signal under the control of the first phase-shift control signal; and
wherein the phase modulator is configured to:
receive the first phase signal; and
perform phase modulation on the first phase signal by using the local oscillator signal obtained after phase shifting performed by the phase shifter to generate the first phase modulation signal.

19. The mobile terminal according to claim 12, wherein the polar phased-array transmitter further comprises a first signal processor, wherein the first signal processor is separately coupled to the polar signal generator and the transmit array; and
wherein the first signal processor is configured to separately perform digital predistortion processing on the n amplitude signals and the n phase signals generated by the polar signal generator.

20. The mobile terminal according to claim 19, wherein the polar phased-array transmitter further comprises a phase-shift controller, the phase-shift controller configured to generate the n phase-shift control signals.

* * * * *